(12) United States Patent
Kim et al.

(10) Patent No.: US 8,907,347 B2
(45) Date of Patent: Dec. 9, 2014

(54) THIN FILM TRANSISTOR ARRAY PANEL AND METHOD FOR MANUFACTURING THE SAME, AND LIQUID CRYSTAL DISPLAY

(75) Inventors: Jin-Seuk Kim, Daejeon (KR); Yui-Ku Lee, Suwon-si (KR); Byoung-Joo Kim, Anyang-si (KR); Chul Huh, Yongin-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 168 days.

(21) Appl. No.: 13/207,883

(22) Filed: Aug. 11, 2011

(65) Prior Publication Data

US 2011/0291102 A1 Dec. 1, 2011

Related U.S. Application Data

(63) Continuation of application No. 12/436,243, filed on May 6, 2009, now Pat. No. 8,026,522.

(30) Foreign Application Priority Data

May 9, 2008 (KR) .......................... 10-2008-0043212

(51) Int. Cl.
| | | |
|---|---|---|
| *H01L 27/15* | (2006.01) | |
| *G02F 1/1368* | (2006.01) | |
| *G02F 1/1335* | (2006.01) | |
| *G02F 1/1362* | (2006.01) | |
| *H01L 27/12* | (2006.01) | |

(52) U.S. Cl.
CPC .. *G02F 1/1368* (2013.01); *G02F 2001/133565* (2013.01); *G02F 1/136227* (2013.01); *H01L 27/1214* (2013.01); *G02F 1/133514* (2013.01)
USPC .......................................................... 257/72

(58) Field of Classification Search
USPC ................ 257/72, E21.7, E21.411, E29.273, 257/E33.068; 438/29, 30
See application file for complete search history.

(56) References Cited

U.S. PATENT DOCUMENTS

| | | | |
|---|---|---|---|
| 2007/0194320 A1* | 8/2007 | Cho et al. | ......................... 257/72 |
| 2008/0252828 A1* | 10/2008 | Shin et al. | ...................... 349/106 |
| 2008/0308826 A1 | 12/2008 | Lee et al. | |
| 2009/0180064 A1 | 7/2009 | Kim et al. | |

FOREIGN PATENT DOCUMENTS

| | | |
|---|---|---|
| KR | 1020060082105 | 7/2006 |
| KR | 1020070009328 | 1/2007 |

* cited by examiner

*Primary Examiner* — Whitney T Moore
(74) *Attorney, Agent, or Firm* — F. Chau & Associates, LLC (57) ABSTRACT

A thin film transistor array panel includes a substrate, a first thin film transistor formed on the substrate, a color filter formed on the first thin film transistor and having a through hole, a capping layer formed on the color filter and having an opening, and a pixel electrode formed on the capping layer and connected to the first thin film transistor through the through hole. The opening exposes the color filter outside the through hole.

13 Claims, 7 Drawing Sheets

THIN FILM TRANSISTOR ARRAY PANEL AND METHOD FOR MANUFACTURING THE SAME, AND LIQUID CRYSTAL DISPLAY

CROSS-REFERENCE TO RELATED APPLICATION

This application is a continuation of U.S. patent application Ser. No. 12/436,243 filed May 6, 2009 now U.S. Pat. No. 8,026,522, which claims priority to Korean Patent Application No. 10-2008-0043212, filed on May 9, 2008, the disclosures of which are each hereby incorporated by reference herein in their entireties.

BACKGROUND OF THE INVENTION (a) Technical Field

The present disclosure relates to a thin film transistor array panel, a method for manufacturing the same, and a liquid crystal display.

(b) Discussion of Related Art

Flat panel displays are thin as compared to conventional cathode ray tube (CRT) displays. Examples of flat panel displays include a liquid crystal display (LCD), a plasma display panel (PDP), and an organic light emitting device (OLED).

The LCD is a display device using electro-optical characteristics of liquid crystals in which light transmission amounts are varied according to the intensity of an applied electric field to thereby realize the display of images. The PDP is a display device for displaying images by using plasma generated by gas discharge. In the OLED, electrons and holes are injected into an organic illumination layer respectively from a cathode (e.g., the electron injection electrode) and an anode (e.g., the hole injection electrode). The injected electrons and holes are combined to generate excitons, which illuminate when transitioning from an excited state to a ground state.

In an active matrix type flat panel display, each pixel may be independently controlled by including switching elements such as thin film transistors. The thin film transistors and a color filter may be formed on a same substrate, which is referred to as "color filter on array" (COA). A capping layer may be formed on the color filter in the COA structure. The capping layer prevents the color filter from lifting by blocking the generation of outgassing from the color filter, thereby reducing image deterioration due to artifacts such as residual images when the display is driven. The color filter may be made of an organic material with some elasticity. The capping layer may be made of an inorganic material with a smaller elasticity and compressibility as compared with the color filter of the organic layer.

Figure 7:
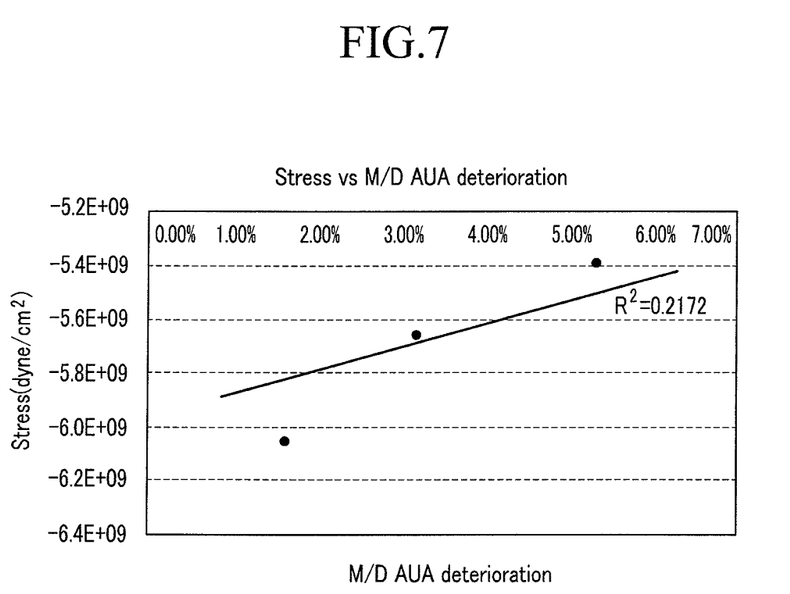
FIG. 7 is a graph showing an example of AUA deterioration according the stress of the capping layer.

However, when the solid capping layer is formed on the soft color filter, stress is generated on the capping layer. Further, the capping layer and the color filter have different compressibility and elasticity, such that a lifting is generated in the interface surface thereof. For example, when contacting a spacer on the capping layer in a liquid crystal display, the compressibility of the contact portion is decreased. Therefore, the margins of the liquid crystal are reduced, and as a result, active unfilled area (AUA) deterioration is generated due to insufficient liquid crystal in some portions of the display area. An example of AUA deterioration generated according to the stress of the capping layer is shown in the graph of FIG. 7.

SUMMARY OF THE INVENTION

A thin film transistor array panel according to an exemplary embodiment of the present invention includes a substrate, a first thin film transistor formed on the substrate, a color filter formed on the first thin film transistor and having a through hole, a capping layer formed on the color filter and having an opening, and a pixel electrode formed on the capping layer and connected to the first thin film transistor through the through hole. The opening exposes the color filter outside the through hole.

The capping layer and the pixel electrode may cover the entire color filter. A portion of the pixel electrode may overlap the capping layer near the opening. The pixel electrode may include a cutout overlapping the capping layer. The width of the capping layer overlapping the cutout may be substantially equal to or larger than the width of the cutout. The pixel electrode may include a first subpixel electrode connected to the first thin film transistor, and a second subpixel electrode separated from the first subpixel electrode. The thin film transistor array panel may further include a plurality of second thin film transistors connected to the second subpixel electrode. The area of the first subpixel electrode may be less than the area of the second subpixel electrode.

A thin film transistor array panel according to another exemplary embodiment of the present invention includes a substrate, a gate line formed on the substrate, a gate insulating layer formed on the gate line, a semiconductor formed on the gate insulating layer, a data line formed on the semiconductor and having a source electrode, a drain electrode formed on the semiconductor separated from the source electrode and having an end portion, a color filter formed on the data line and the drain electrode and having a through hole, a pixel electrode formed on the color filter and connected to the drain electrode through the through hole, and a capping layer formed between the pixel electrode and the color filter and having an opening passing through the through hole (e.g., located at a position corresponding to the through hole). The opening has a larger area than the through hole.

The area of the opening may be equal to or smaller than the area of the end portion of the drain electrode. The thin film transistor array panel may further include a storage electrode line formed on the substrate and disposed on a same layer as the gate line.

A thin film transistor array panel according to another exemplary embodiment of the present invention includes a substrate, a gate line formed on the substrate, a gate insulating layer formed on the gate line, a semiconductor formed on the gate insulating layer, a data line formed on the semiconductor and including a source electrode, a drain electrode formed on the semiconductor separated from the source electrode and having an end portion, a color filter formed on the data line and the drain electrode and having a through hole, a capping layer formed on the color filter and having a first opening, and a pixel electrode fanned on the capping layer and connected to the drain electrode. The first opening overlaps an edge portion of the pixel electrode and extends in a direction parallel to the data line.

The first opening may overlap the data line. The thin film transistor array panel may further include a second opening passing through the through hole (e.g., located at a position corresponding to the through hole) and having a larger area than the area of the through hole. The area of the second opening may be equal to or less than the area of the end portion of the drain electrode.

A liquid crystal display according to an exemplary embodiment of the present invention includes a plurality of thin film transistors, a color filter formed on the thin film transistors, a capping layer formed on the color filter and having a plurality of openings, a plurality of pixel electrodes formed on the capping layer and including a plurality of cutouts, a common electrode facing the pixel electrodes, and a liquid crystal layer formed between the pixel electrodes and the common electrode. The opening and the cutout are alternatively disposed in one direction. The capping layer and the pixel electrode may cover the entire color filter.

A method of manufacturing a thin film transistor array panel according to an exemplary embodiment of the present invention includes forming a plurality of thin film transistors on a substrate, forming a color filter having a through hole on the thin film transistor, forming a capping layer on the color filter, forming a first opening passing through the through hole (e.g., located at a position corresponding to the through hole) and larger than the area of the through hole in the capping layer, and forming a pixel electrode connected to the thin film transistor through the through hole and the opening on the capping layer.

The forming of the first opening may include forming a second opening overlapping an edge of the pixel electrode in the capping layer through the through hole. The second opening may be formed to be larger than the area of the through hole in the capping layer

DETAILED DESCRIPTION OF EXEMPLARY EMBODIMENTS

Hereinafter, exemplary embodiments of the present invention will be described more fully hereinafter with reference to the accompanying drawings In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present. A thin film transistor array panel according to an exemplary embodiment of the present invention will be described with reference to FIG. 1 to FIG. 4. While a liquid crystal display is described in FIG. 1 to FIG. 4, the thin film transistor array panel may be applied to other types of display devices.

Figure 1:
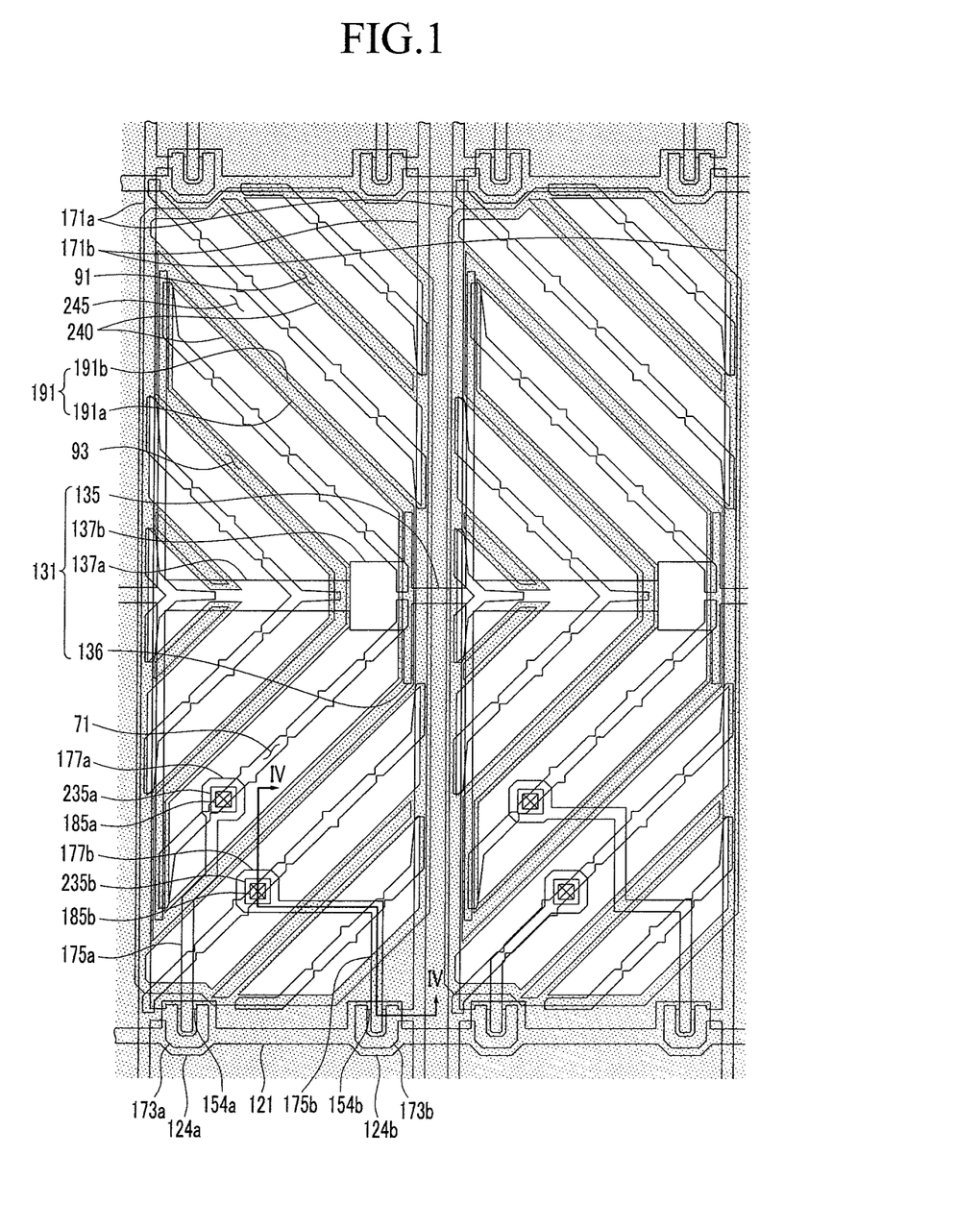
FIG. 1 is a layout view of a liquid crystal display including a thin film transistor array panel according to an exemplary embodiment of the present invention.
Figure 2:
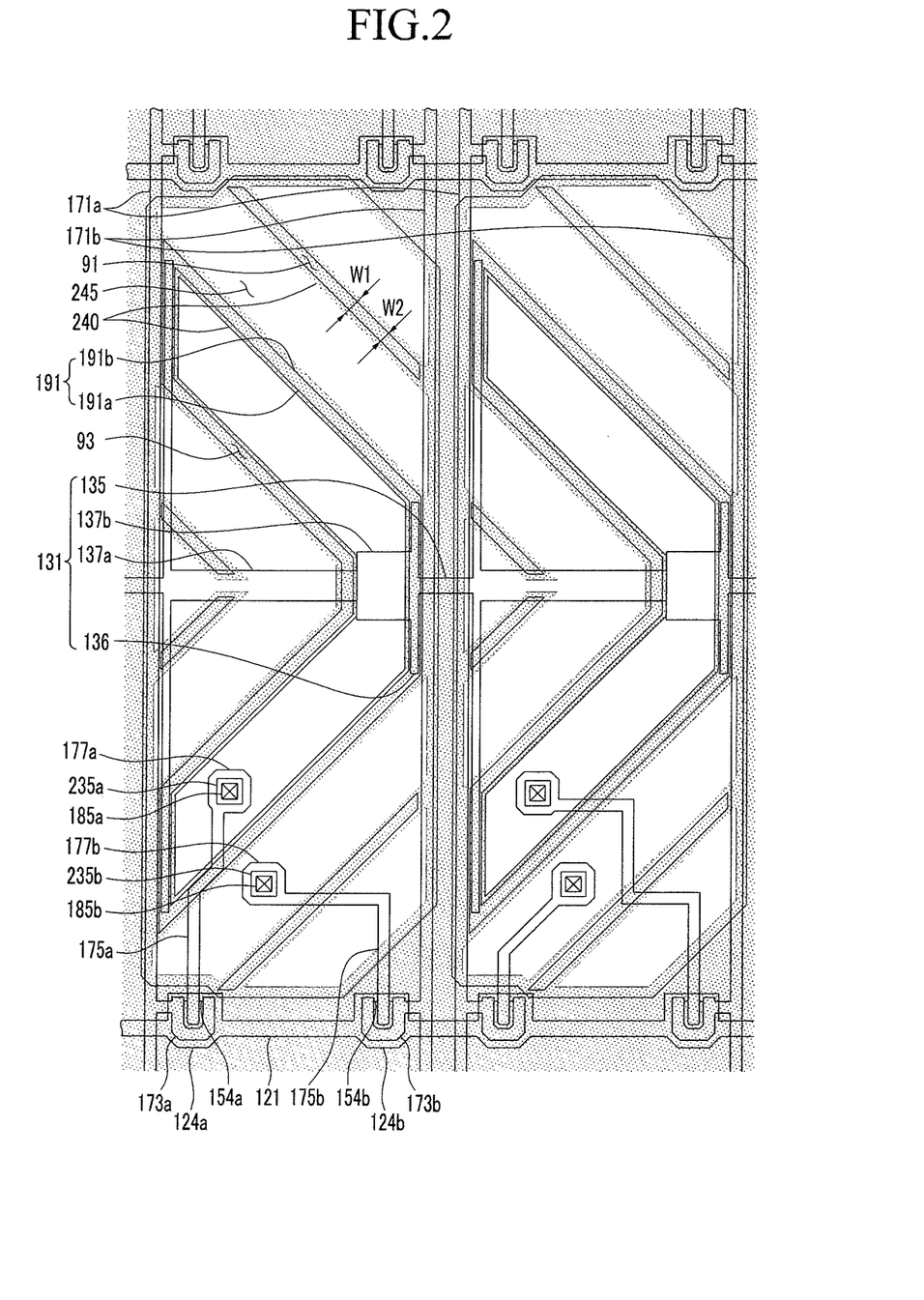
FIG. 2 is a layout view of the thin film transistor array panel shown in FIG. 1.
Figure 3:
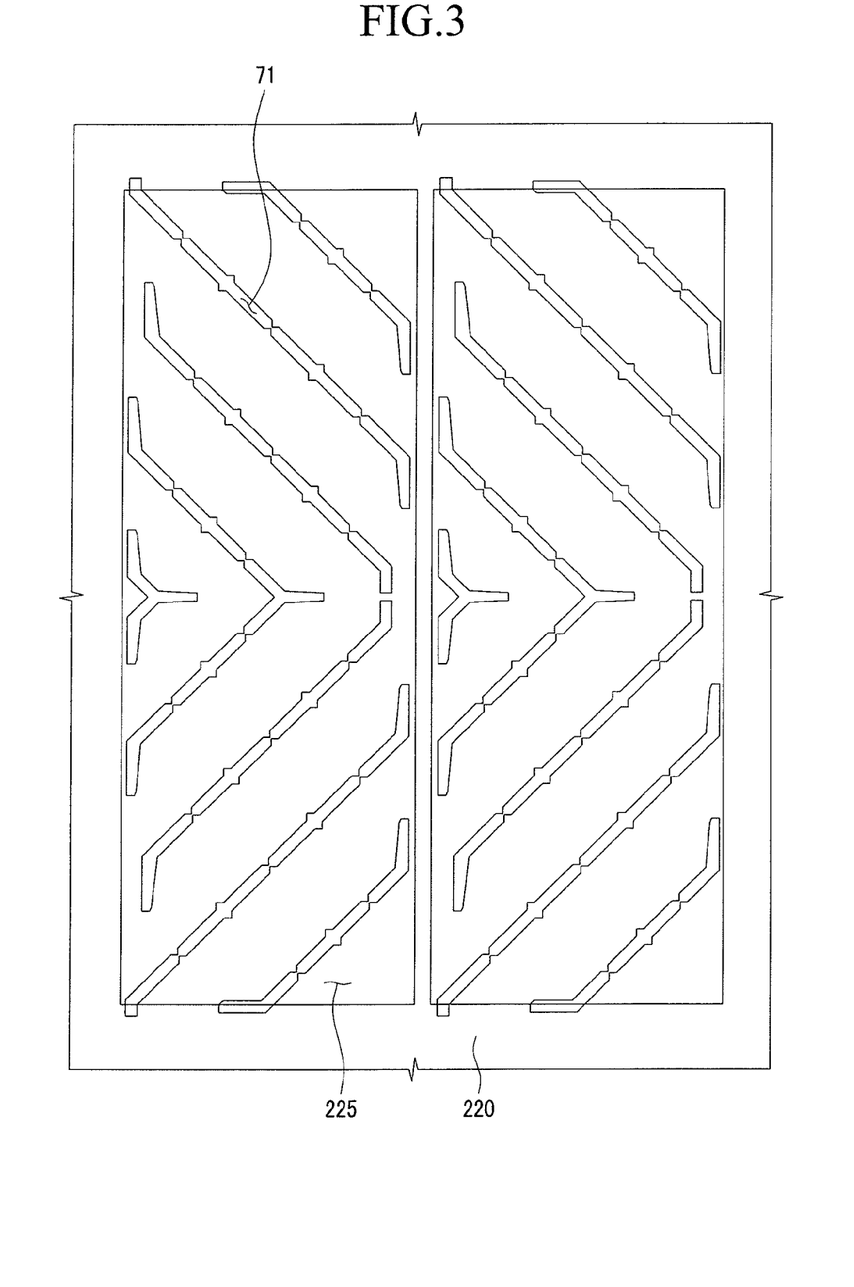
FIG. 3 is a layout view of the common electrode panel shown in FIG. 1.
Figure 4:
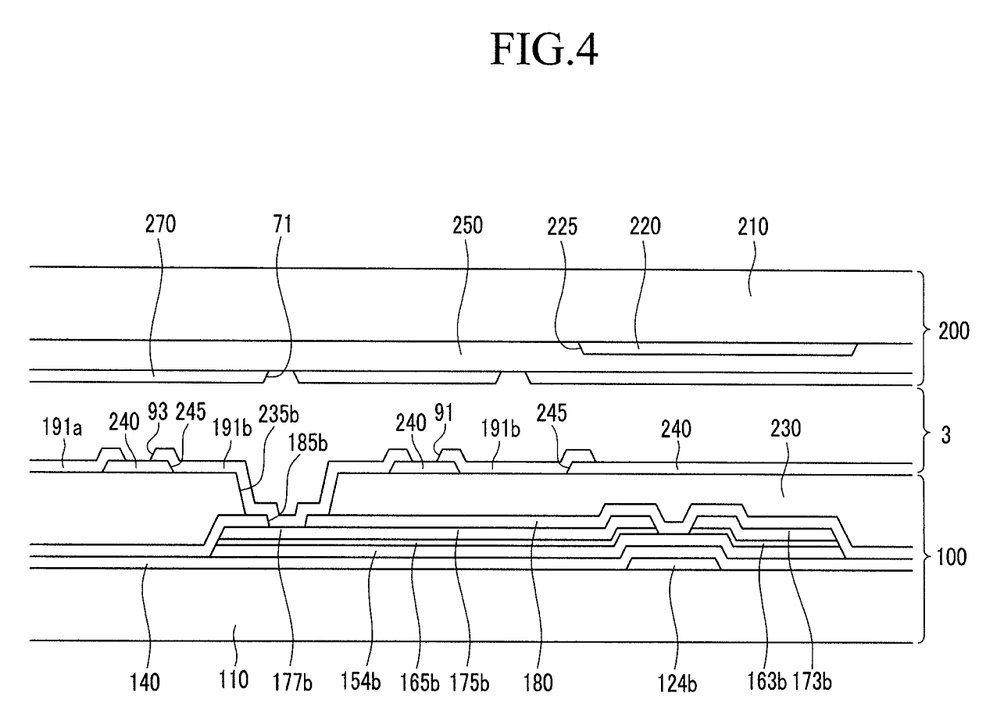
FIG. 4 is a cross-sectional view of the liquid crystal display shown in FIG. 1 taken along the line IV-IV.

FIG. 1 is a layout view of a liquid crystal display including a thin film transistor array panel according to an exemplary embodiment of the present invention, FIG. 2 is a layout view of the thin film transistor array panel shown in FIG. 1, FIG. 3 is a layout view of a common electrode panel shown in FIG. 1, and FIG. 4 is a cross-sectional view of the liquid crystal display shown in FIG. 1 taken along line IV-IV.

Referring to FIG. 1 to FIG. 4, a display device includes a thin film transistor array panel 100 and a common electrode panel 200 facing each other, and a liquid crystal layer 3 formed between the two display panels 100 and 200.

The liquid crystal layer 3 may have negative dielectric anisotropy. The liquid crystal molecules of the liquid crystal layer 3 may be arranged such that a longitudinal axis of the liquid crystal molecules is perpendicular to the surfaces of the two panels when an electric field is not present.

Alignment layers (not shown) may be applied to inner surfaces of the display panels 100 and 200, and may be homeotropic alignment layers. At least one polarizer (not shown) may be attached on outside surfaces of the display panels 100 and 200.

A light blocking member 220 is formed on an insulating substrate 210. The insulating substrate 210 may be made of a transparent material such as glass or plastic. The light blocking member 220 has an opening 225 facing a pixel electrode 191, and blocks light leakage between the pixel electrodes 191. An insulating layer 250 providing a flat surface is formed on the light blocking member 220. The insulating layer 250 may be omitted.

A common electrode 270 is formed on the insulating layer 250. The common electrode 270 is made of a transparent conductor such as Indium Tin Oxide (ITO) or Indium Zinc Oxide (IZO), and receives a common voltage. The common electrode 270 includes a plurality of cutouts 71. Each of the cutouts 71 has at least one slanted portion extending in a substantially oblique direction, and each slanting portion has a plurality of notches that may be concave or convex.

A plurality of gate lines 121 and a plurality of storage electrode lines 131 are formed on an insulating substrate 110. The insulating substrate may be made of a transparent material such as glass or plastic.

The gate lines 121 extend substantially in a transverse direction and transmit gate signals. Each gate line 121 includes a plurality of first and second gate electrodes 124a and 124b protruding upward and downward.

The storage electrode lines 131 extend substantially in a transverse direction and parallel to the gate lines 121, and are supplied with a predetermined voltage. Each storage electrode line 131 is disposed between two neighboring gate lines 121. Each storage electrode line 131 may be spaced an equal distance from each of the two neighboring gate lines 121. The storage electrode lines 131 include the first and second storage electrodes 137a and 137b, a branch electrode 136, and a connection 135. The first and second storage electrodes 137a and 137b are approximately rectangular and are connected to each other. The horizontal length of the first storage electrode 137a may be longer than that of the second storage electrode 137b. The vertical length of the first storage electrode 137a may be shorter than that of the second storage electrode 137b. The branch electrode 136 is connected to the end of the second storage electrode 137b and extends in the longitudinal direction near the gate line 121. The transverse length of the branch electrode 136 may be short. The connection 135 connects the branch electrode 136 to the neighboring first storage electrode 137a. The vertical length of the connection 135 may be shorter than the vertical lengths of the first and second storage electrodes 137a and 137b. The shapes and arrangements of the storage electrode lines 131 can be modified in various forms.

A gate insulating layer 140 is formed on the gate lines and storage electrode lines. The gate insulating layer 140 may include silicon nitride (SiNx) or silicon oxide (SiOx).

A plurality of first and second semiconductor islands 154a and 154b are formed on the gate insulating layer 140. The first and second semiconductor islands 154a and 154b may be formed of hydrogenated amorphous silicon (a-Si) or polysilicon. The first semiconductor island 154a overlaps the first gate electrodes 124a and the second semiconductor island 154b overlaps the second gate electrodes 124b.

A pair of first ohmic contact islands 163a and 165a (not shown) are formed on the first semiconductor island 154a, and a pair of second ohmic contact islands 163b and 165b are formed on the second semiconductor island 154b. Although not shown, the ohmic contact islands 163a and 165a have the same or substantially the same structure as that of the ohmic contact islands 163b and 165b. The ohmic contacts 163a, 165a, 163b, and 165b may be formed of a material such as n+ hydrogenated amorphous silicon, in which an n-type impurity is doped with a high concentration, or of silicide.

A plurality of first and second data lines 171a and 171b and a plurality of first and second drain electrodes 175a and 175b are formed on the ohmic contacts 163a and 165a and 163b and 165b, and on the gate insulating layer 140.

The first and second data lines 171a and 171b transmit data signals, extend substantially in the vertical direction, and cross the gate lines 121 and the connection 135 of the storage electrode lines 131. The first data line 171a includes a first source electrode 173a that extends toward the first gate electrode 124a and may be curved with a "U" shape. The second data line 171b includes a second source electrode 173b that extends toward the second gate electrode 124b and may be curved with a "U" shape.

The drain electrodes 175a and 175b are separated from the data lines 171a and 171b. Each of the drain electrodes 175a and 175b include one end enclosed by a corresponding one of the source electrodes 173a and 173b and another end having a wide area. Referring to FIG. 1 and FIG. 2, a left pixel is disposed between a first pair of data lines 171a and 171b and a second pair of data lines 171a and 171b, and a right pixel is disposed between a third pair of data lines 171a and 171b and a fourth pair of data lines 171a and 171b. The contents of the left and right pixels are similar. However, the wide end portion 177a of the first drain electrode 175a disposed in the left pixel is disposed closer to the storage electrode line 131 than the second drain electrode 175b, and the wide end portion 177b of the second drain electrode 175b disposed in the right pixel is disposed closer to the storage electrode line 131 than the first drain electrode 175a. The plane shape of the drain electrodes may vary in each pixel. However, the plane shape of the drain electrodes 175a and 175b may be the same in all pixels.

The first/second gate electrodes 124a/124b, the first/second source electrodes 173a/173b and the first/second drain electrodes 175a/175b form the first/second thin film transistors (TFT) along with the first/second semiconductors 154a/154b. The channels of the first/second thin film transistors are formed in the first/second semiconductors 154a/154b between the first/second source electrodes 173a/173b and the first/second drain electrodes 175a/175b.

The ohmic contact islands 163a and 165a and 163b and 165b, are disposed between the semiconductors 154a and 154b therebelow, and the data lines 171a and 171b and drain electrodes 175a and 175b thereabove, and reduce contact resistance between them. The semiconductors 154a and 154b have portions that are exposed without being covered by the data lines 171a and 171b and the drain electrodes 175a and 175b, including a region between the source electrodes 173a and 173b and drain electrodes 175a and 175b.

A passivation layer 180 is formed on the source electrodes 173a and 173b, the drain electrodes 175a and 175b, and the exposed semiconductors 154a and 154b. The passivation layer 180 may be made of an inorganic insulator such as silicon nitride or silicon oxide. However, the passivation layer 180 may be omitted.

The passivation layer 180 has contact holes 185a and 185b respectively exposing the wide end portions 177a and 177b of the drain electrodes 175a and 175b.

A color filter 230 is formed on the passivation layer 180. The color filter 230 is arranged between the first data line 171a and the second data line 171b, and may be elongated in a vertical direction along the data lines 171a and 171b to form a stripe. The boundary of two neighboring color filters 230 may be disposed between two nearest data lines 171a and 171b such that the two color filters 230 overlap each other to serve as a light blocking member blocking light leakage generated between the pixel electrodes 191. The color filters 230 may represent one of three primary colors such as red, green, and blue, and may be made of a photosensitive organic material including pigments.

The color filters 230 have through holes 235a and 235b through which the contact holes 185a and 185b pass. The through holes 235a and 235b are larger than the contact holes 185a and 185b.

A capping layer 240 may be made of an inorganic insulator such as silicon nitride or silicon oxide, and is formed on the color filter 230. The capping layer 240 includes a straight portion overlapping the gate line 121 and the data lines 171a and 171b, and an oblique portion formed in about a 45 degree angle with respect to the gate line 121. A portion of the capping layer 240 is removed between neighboring oblique portions to form an opening 245 exposing the color filter 230.

A pixel electrode 191 is formed on the capping layer 240. The pixel electrode 191 may be made of a transparent conductive material such as ITO or IZO, or a reflective metal such as aluminum, silver, chromium, or alloys thereof.

The pixel electrode 191 includes a first sub-pixel electrode 191a and a second sub-pixel electrode 191b larger than the first sub-pixel electrode 191a.

The first sub-pixel electrode 191a may have a band shape approximately resembling a less-than sign (<). The first sub-pixel electrode 191a is enclosed by the second sub-pixel electrode 191b via a gap 93 interposed therebetween. The second sub-pixel electrode 191b has a plurality of cutouts 91 with a straight band shape and the cutouts 91 may be disposed at an angle of about 45 degrees with respect to the gate lines 121 and the data lines 171a and 171b. The gap 93 includes a plurality of oblique portions substantially parallel to the cutouts 91, and a plurality of longitudinal portions substantially parallel to the data lines 171a and 171b.

The cutouts 91 and the gap 93 of the second pixel electrode 191b overlap the oblique portion of the capping layer 240, and may be alternately arranged with the cutouts 71 of the common electrode 270. The capping layer 240 covers a part of the color filter 230 that is not covered by the first and second pixel electrodes 191a and 191b.

The first and second subpixel electrodes 191a and 191b have almost the same shape as the opening 245, and the majority thereof is disposed in the opening 245. The width $W_1$ of the oblique portion of the capping layer 240 is wider than the width $W_2$ of the cutout 91 such that the edges of the first and second subpixel electrodes 191a and 191b overlap the edge of the capping layer 240. However, the first and second subpixel electrodes 191a and 191b need not overlap the capping layer 240, and the width $W_1$ of the oblique portion of the capping layer 240 may be substantially the same as the width $W_2$ of the cutout 91.

When the opening 245 is formed, the stress generated by the capping layer 240 may be reduced, and furthermore lifting in the interface between the capping layer 240 and the color filter 230 may be prevented such that the AUA deterioration may be prevented. For example, when the amount of liquid crystal molecules of the liquid crystal layer 3 is insufficiently filled by about 6% with respect to a standard fill percentage value, the AUA deterioration may not be presented.

The capping layer 240 and the pixel electrode 191 cover the whole color filter 230 such that they may prevent the color filter 230 from being lifted and suppress contamination of the liquid crystal layer 3 by an organic material such as a solvent inflowed from the color filter 230, and thereby artifacts such as afterimages that may be generated during driving of the display may be prevented.

The first/second subpixel electrodes 191a/191b are connected to the first/second drain electrodes 175a/175b of the first/second thin film transistors through the opening 245 and the contact holes 185a/185b. In FIG. 2, the first subpixel electrode 191a disposed in the left pixel is connected to the first drain electrode 175a disposed in the left side, and the first subpixel electrode 191a disposed in the neighboring pixel of the right side is connected to the second drain electrode 175b disposed in the right side.

The first/second subpixel electrodes 191a/191b receive data voltages from the first/second drain electrodes 175a/175b. The first/second subpixel electrodes 191a/191b applied with the data voltages generate an electric field along with the common electrode 270 of the common electrode panel 200 such that the orientation of the liquid crystal molecules of the liquid crystal layer 3 between the electrodes 191a/191b and 270 is determined. Accordingly, the luminance of the light transmitted through the liquid crystal layer 3 differs depending on the thusly determined orientation of the liquid crystal molecules.

The first thin film transistor and the first subpixel electrode 191a, and the liquid crystal layer 3, the common electrode 270, and the polarizer that are disposed on them, form a unit for displaying one luminance point that is referred to as the first subpixel hereafter. The second thin film transistor and the second subpixel electrode 191b, and the liquid crystal layer 3, the common electrode 270, and the polarizer that are disposed on them, form a unit for displaying one luminance point that is referred to as the second subpixel hereafter. The first subpixel and the second subpixel are combined to represent one effective luminance point, which can be used to represent one pixel.

The first/second subpixel electrodes 191a/191b and the common electrode 270 form the first/second capacitors (called liquid crystal capacitors) to maintain the applied voltage even after the TFT is turned off. The first/second subpixel electrodes 191a/191b and the storage electrode line 131 form a storage capacitor.

Figure 5:
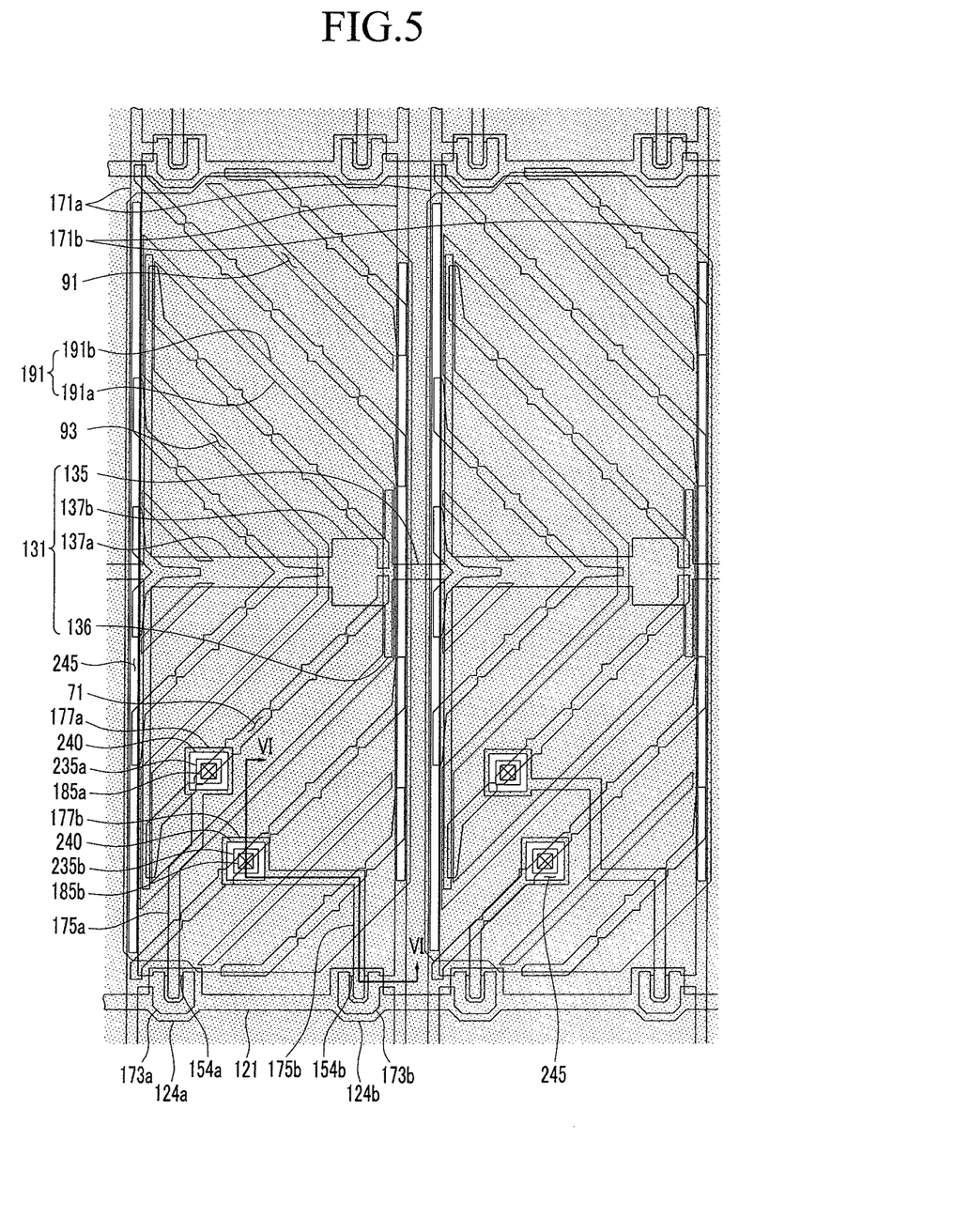
FIG. 5 is a layout view of a liquid crystal display including a thin film transistor array panel according to another exemplary embodiment of the present invention.
Figure 6:
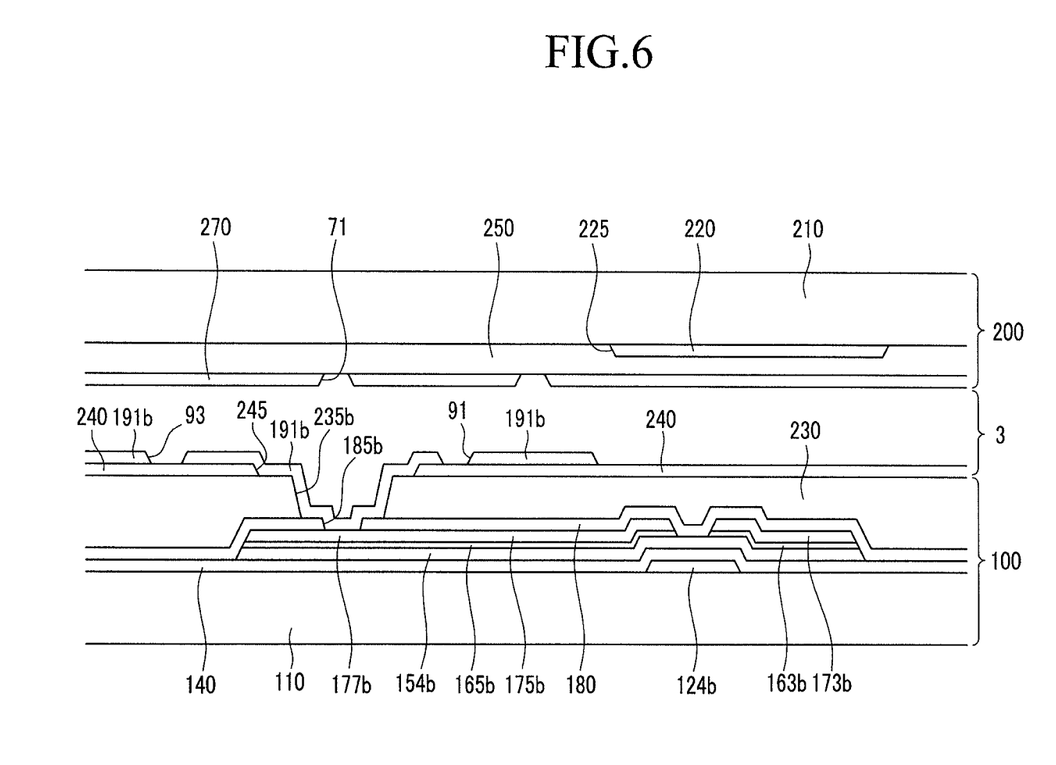
FIG. 6 is a cross-sectional view of the liquid crystal display shown in FIG. 5 taken along the line VI-VI.

FIG. 5 is a layout view of a liquid crystal display including a thin film transistor array panel according to another exemplary embodiment of the present invention, and FIG. 6 is a cross-sectional view of the liquid crystal display shown in FIG. 5 taken along the line VI-VI.

Referring to FIG. 5 and FIG. 6, a liquid crystal display includes a thin film transistor array panel 100 including the first and second thin film transistors, a color filter 230, a capping layer 240 and a pixel electrode 191, a common electrode panel 200 including a light blocking member 220 and a common electrode 270, and a liquid crystal layer 3 formed between the display panels 100 and 200.

The structures of the thin film transistor array panel 100, the common electrode panel 200, and the liquid crystal layer 3 are similar to the structures of the exemplary embodiment shown in FIG. 1 to FIG. 4.

However, the capping layer 240 according to the present exemplary embodiment has an opening 245 formed near the through holes 235a and 235b of the color filter 230 and under the edges of the first and second pixel electrodes 191a and 191b, differently from the capping layer 240 shown in FIG. 1, FIG. 2, and FIG. 4.

In the planar view, the opening 245 near the through holes 235a and 235b may have an approximately square shape. The area of the opening 245 is larger than the area of the through holes 235a and 235b, and may be equal to or less than the area of the wide end portions 177a and 177b of the drain electrodes 175a and 175b. The opening 245 disposed under the edges of the first and second pixel electrodes 191a and 191b may have nearly a rectangular shape in the direction of the data lines 171a and 171b and overlaps the data lines 171a and 171b.

The capping layer 240 according to the present exemplary embodiment may have only one opening 245 either near the through holes 235a and 235b or disposed under the edge of the first and second pixel electrodes 191a and 191b.

Many characteristics of the exemplary embodiment shown in FIG. 1 to FIG. 4 may apply to the exemplary embodiment shown in FIG. 5 and FIG. 6.

When the opening 245 is formed, the stress generated by the capping layer 240 may be reduced, and furthermore the lifting in the interface between the capping layer 240 and the color filter 230 may be prevented such that the AUA deterioration may be prevented. The capping layer 240 and the pixel electrode 191 cover the whole color filter 230 such that they may prevent the color filter 230 from being lifted and suppress contamination of the liquid crystal layer 3 by an organic material such as a solvent inflowed from the color filter 230, and thereby artifacts such as afterimages that may be generated during driving may be prevented.

A method of manufacturing a liquid crystal display including a thin film transistor array panel according to an exemplary embodiment of the present invention will be described with reference to FIG. 5 and FIG. 6.

The first and second thin film transistors including the first and second gate electrodes 124a and 124b, the first and second source electrodes 173a and 173b, the first and second drain electrodes 175a and 175b, and the first and second semiconductors 154a and 154b are formed on a substrate 110.

Next, a passivation layer 180 and a color filter 230 are deposited on the first and second thin film transistors. Next, through holes 235a and 235b are formed in the color filter 230.

Next, an inorganic material is deposited on the color filter 230 to form a capping layer 240. Next, the capping layer 240 is etched to form an opening 245 larger than the through holes 235a and 235b near the through holes 235a and 235b. When etching the capping layer 240, the passivation layer 180 exposed through the through holes 235a and 235b may be etched to form contact holes 185a and 185b.

Next, a pixel electrode 191 connected to the first and second drain electrodes 175a and 175b through the opening 245, the through holes 235a and 235b, and the contact holes 185a and 185b is formed on the capping layer 240.

Next, a common electrode panel 200 including a light blocking member 220 and a common electrode 270 is combined with the thin film transistor array panel 100, and liquid crystal molecules are injected between the two display panels 100 and 200 to form a liquid crystal layer 3. The liquid crystal layer 3 may be formed before the combination of the two display panels 100 and 200 or after the combination.

The manufacturing method of the liquid crystal display according to the exemplary embodiment shown in FIG. 1 to FIG. 4 is similar to the above described method. However, as shown in FIG. 6, the resulting shape of the opening 245 of the capping layer 240 formed in the method described with respect to FIGS. 5-6 differs with respect to the capping layer 240 formed by the method described with respect to FIGS. 1-4.

Having described exemplary embodiments of the present invention, it is to be understood that the invention is not limited to the disclosed embodiments, but, on the contrary, is intended to cover various modifications and equivalent arrangements included within the spirit and scope of the disclosure.

What is claimed is:

1. A thin film transistor array panel comprising:
   a substrate;
   a first thin film transistor formed on the substrate;
   a color filter formed on the first thin film transistor;
   a capping layer formed on the color filter; and
   a pixel electrode formed on the capping layer,
   wherein a through hole is formed in the color filter,
   wherein a first opening and a second opening are formed in the capping layer,
   wherein the pixel electrode is connected to the first thin film transistor through the first opening and the through hole,
   wherein the second opening is separated from the first opening,
   wherein the second opening is covered with the pixel electrode,
   wherein the first opening and the second opening are through holes of the capping layer, and
   wherein the color filter is formed continuously below a portion where the second opening is disposed.

2. The thin film transistor array panel of claim 1, wherein a part of the pixel electrode that covers the second opening directly contacts an upper surface of the color filter that is also in direct contact with a bottom surface of the capping layer.

3. The thin film transistor array panel of claim 1, wherein a part of the pixel electrode that covers the second opening is substantially level with a bottom surface of the capping layer.

4. The thin film transistor array panel of claim 1, wherein a part of the pixel electrode that covers the second opening directly contacts the capping layer and the color filter.

5. The thin film transistor array panel of claim 1, wherein the entire color filter is covered by a combination of the capping layer and the pixel electrode.

6. The thin film transistor array panel of claim 1, wherein a cutout overlapping the capping layer is formed in the pixel electrode.

7. The thin film transistor array panel of claim 6, wherein a part of the capping layer with a sub-part overlapping the cutout is substantially equal to or larger than the width of the cutout.

8. The thin film transistor array panel of claim 1, further comprising:
   a plurality of second thin film transistors connected to the first subpixel electrode.

9. The thin film transistor array panel of claim 1, wherein the area of the first subpixel electrode is less than the area of the second subpixel electrode.

10. The thin film transistor array panel of claim 1, wherein the first opening is formed along an extension direction of the pixel electrode.

11. A thin film transistor array panel comprising:
    a substrate;
    a first thin film transistor formed on the substrate;
    a color filter formed on the first thin film transistor and having a through hole;
    a capping layer formed on the color filter, and comprising a first opening and a second opening; and
    a pixel electrode formed on the capping layer and connected to the first thin film transistor through the first opening and the through hole,
    wherein the second opening is separated from the first opening,
    wherein the second opening is covered with the pixel electrode,
    wherein a part of the pixel electrode that covers the second opening directly contacts an upper surface of the color filter that is also in direct contact with a bottom surface of the capping layer.

12. A thin film transistor array panel comprising:
    a substrate;
    a first thin film transistor formed on the substrate;
    a color filter formed on the first thin film transistor and having a through hole;
    a capping layer formed on the color filter, and comprising a first opening and a second opening; and
    a pixel electrode formed on the capping layer and connected to the first thin film transistor through the first opening and the through hole,
    wherein the second opening is separated from the first opening,
    wherein the second opening is covered with the pixel electrode,
    wherein a part of the pixel electrode that covers the second opening directly contacts the capping layer and the color filter.

13. A thin film transistor array panel comprising:
    a substrate;
    a first thin film transistor formed on the substrate;
    a color filter formed on the first thin film transistor and having a through hole;
    a capping layer formed on the color filter, and comprising a first opening and a second opening;
    a pixel electrode formed on the capping layer and connected to the first thin film transistor through the first opening and the through hole; and
    a plurality of second thin film transistors,
    wherein the second opening is separated from the first opening,
    wherein the second opening is covered with the pixel electrode,
    wherein the pixel electrode comprises a first subpixel electrode connected to the first thin film transistor and a second subpixel electrode separated from the first subpixel electrode, and
    wherein the second thin film transistors are connected to the second subpixel electrode.

* * * * *